US008665627B2

(12) United States Patent
Lee et al.

(10) Patent No.: US 8,665,627 B2
(45) Date of Patent: *Mar. 4, 2014

(54) BUILT-IN SELF TEST FOR ONE-TIME-PROGRAMMABLE MEMORY

(71) Applicant: Analog Devices, Inc., Norwood, MA (US)

(72) Inventors: James M. Lee, Northborough, MA (US); Howard R. Samuels, Newton, MA (US); Thomas W. Kelly, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/936,313

(22) Filed: Jul. 8, 2013

(65) Prior Publication Data

US 2013/0294143 A1 Nov. 7, 2013

Related U.S. Application Data

(63) Continuation of application No. 13/188,994, filed on Jul. 22, 2011, now Pat. No. 8,508,972.

(60) Provisional application No. 61/367,236, filed on Jul. 23, 2010.

(51) Int. Cl.
 *G11C 17/00* (2006.01)
(52) U.S. Cl.
 USPC ............................ 365/96; 365/225.7; 365/201
(58) Field of Classification Search
 USPC ....................... 365/96, 225.7, 201, 189.09, 94
 See application file for complete search history.

(56) References Cited

U.S. PATENT DOCUMENTS

| 4,718,042 | A  | 1/1988  | Moll et al. ..................... 365/201 |
| 4,809,231 | A  | 2/1989  | Shannon et al. ............... 365/201 |
| 5,007,026 | A  | 4/1991  | Gaultier et al. ................ 365/201 |
| 5,315,177 | A  | 5/1994  | Zagar et al. .................... 307/465 |
| 5,893,744 | A  | 4/1999  | Wang ............................. 438/401 |
| 6,249,457 | B1 | 6/2001  | Okamoto ................... 365/185.21 |
| 6,768,694 | B2 | 7/2004  | Anand et al. ................ 365/225.7 |
| 6,861,186 | B1 | 3/2005  | Pagette et al. .................... 430/22 |
| 7,136,322 | B2 | 11/2006 | Brennan et al. ............ 365/225.7 |

(Continued)

OTHER PUBLICATIONS

Edelstein, et al., "Process Integration Aspects of Back Illuminated CMOS Imagers Using Smart Stacking™ Technology with Best in Class Direct Bonding," 2011 Int'l Image Sensor Workshop, Jun. 8-11, 2011, 4 pages.

(Continued)

*Primary Examiner* — David Lam
(74) *Attorney, Agent, or Firm* — Sunstein Kann Murphy & Timbers LLP (57) ABSTRACT

An apparatus and method of testing one-time-programmable memory provides one-time-programmable memory having one or more memory locations for storing data and corresponding programming circuitry for each memory location. In addition, each programming circuitry has a circuit element configured to permanently change state to store the data in the memory. The method also reads each memory location to verify that the memory location is unprogrammed and activates the programming circuitry for each memory location, which applies a test current to the programming circuitry. The test current is less than a threshold current needed to permanently change the state of the circuit element. The method then determines whether the programming circuitry is functioning properly.

7 Claims, 6 Drawing Sheets

(56) References Cited

U.S. PATENT DOCUMENTS

| | | | |
|---|---|---|---|
| 7,307,911 B1 | 12/2007 | Anand et al. | 365/225.7 |
| 7,339,848 B1 | 3/2008 | Stansell et al. | 365/225.07 |
| 7,426,142 B1 | 9/2008 | Stansell et al. | 365/185.21 |
| 7,494,830 B2 | 2/2009 | Liu et al. | 438/16 |
| 7,843,747 B2 | 11/2010 | Hsueh et al. | 365/201 |
| 8,059,479 B2 * | 11/2011 | Kurjanowicz | 365/201 |
| 8,508,972 B2 * | 8/2013 | Lee et al. | 365/96 |
| 2004/0063237 A1 | 4/2004 | Yun et al. | 438/48 |
| 2004/0239405 A1 | 12/2004 | Mayer et al. | 327/525 |
| 2005/0059255 A1 | 3/2005 | Varnerin, III et al. | 438/720 |
| 2008/0238439 A1 | 10/2008 | Lin et al. | 324/550 |
| 2009/0251943 A1 | 10/2009 | Kurjanowicz | 365/96 |
| 2011/0149062 A1 | 6/2011 | Capidell et al. | 348/87 |

OTHER PUBLICATIONS

European Patent Office, Authorized Officer, Rios Báez, Abel, International Search Report—International Application No. PCT/US2011/045013, dated Nov. 21, 2011, together with the Written Opinion of the International Searching Authority, 8 pages.

European Patent Office, Authorized Officer, Rios Báez, Abel, International Search Report—International Application No. PCT/US2011/044998, dated Nov. 21, 2011, together with the Written Opinion of the International Searching Authority, 8 pages.

* cited by examiner

BUILT-IN SELF TEST FOR ONE-TIME-PROGRAMMABLE MEMORY

This patent application is a continuation of U.S. patent application Ser. No. 13/188,994, filed Jul. 22, 2011, now U.S. Pat. No. 8,508,972, and like that application, claims priority to U.S. Provisional Patent Application No. 61/367,236 filed Jul. 23, 2010, the disclosure of which applications are incorporated by reference herein in their entirety. This patent is also related to U.S. patent application Ser. No. 13/188,845 entitled APPARATUS AND METHOD FOR TESTING ONE-TIME-PROGRAMMABLE MEMORY filed Jul. 22, 2011, the disclosure of which is incorporated by reference herein in its entirety.

TECHNICAL FIELD

The invention generally relates to built-in self tests of circuitry and, more particularly, the invention relates to testing one-time-programmable memory.

BACKGROUND ART

One-time-programmable memory often includes a fuse that can be programmed one time only. Quite often, a user programs one-time-programmable memory well down the design chain; namely, after the memory is integrated into a larger system. Accordingly, if either the memory or its corresponding programming circuitry is defective, an entire system can malfunction. While some of the surrounding logic may be tested at the factory before shipment, the ability to test whether the memory or its corresponding programming circuitry is functioning properly is typically only detected at the time of programming. Thus, the ability to verify the programmability of the memory and its corresponding programming circuitry prior to its actual programming can improve the defect rate seen at programming time.

SUMMARY OF VARIOUS EMBODIMENTS OF THE INVENTION

In accordance with one embodiment of the invention, an apparatus and method of testing one-time-programmable memory provides one-time-programmable memory having one or more memory locations for storing data and corresponding programming circuitry for each memory location. In addition, each programming circuitry has a circuit element configured to permanently change state to store data in the memory. The method also reads each memory location to verify that the memory location is unprogrammed and activates the programming circuitry for each memory location, which applies a test current to the programming circuitry. The test current is less than a threshold current needed to change the state of the circuit element, e.g., blow a fuse. The method then determines whether the programming circuitry is functioning properly.

In some embodiments, the programming circuitry is activated by transmitting a low amplitude signal toward a one-time-programmable memory, which has a fuse configured to blow upon receipt of a signal having a threshold amplitude. The low amplitude signal is less than the threshold amplitude. The method then uses blow circuitry to attempt to assert a blow signal to the fuse. When not defective, blow circuitry is configured to permit the low amplitude signal to flow through the fuse when the fuse is not blown and the blow signal is asserted. The fuse does not blow in response to flow of the low amplitude signal. The method then produces an output signal having a success value if the low amplitude signal flows through the fuse, and a failure value if the low amplitude signal does not flow through the fuse.

Limiting current flow through the one-time-programmable memory may involve imposing a high impedance between a voltage source and the memory. Whereas connection of the voltage source to the fuse without limiting current flow and with assertion of the blow signal when the blow signal assertion circuitry is not defective causes the fuse to blow, the current signal during testing can flow safely through the fuse. The current signal is less than the threshold current for blowing the fuse.

During testing, an output signal indicates success or failure. In various embodiments, the output signal has the failure value if the blow circuitry cannot assert the blow signal to the fuse. In addition, the output signal may have the failure value if the fuse (already) is blown. When the fuse is intact and conducts a current, a success value is indicated by the output signal. In a particular embodiment, the output circuit detects a voltage at a fuse supply to the fuse.

In accordance with various embodiments, asserting a blow signal, when the blow signal assertion circuitry is not defective, substitutes a low impedance for a high impedance in series with the fuse. Thus current may flow through the fuse. Upon connection of the fuse to a voltage source and substitution of the low impedance for the high impedance in series with the fuse, the fuse is expected to blow.

In accordance with an embodiment of a test circuit for testing a one-time-programmable memory, a fuse supply is connected to a fuse. A low impedance path is connected to the fuse supply and is capable of providing more than a threshold current to blow the fuse. A high impedance path is connected to the fuse supply for providing a current limited to less than the threshold current. In particular embodiments, the low impedance path and the high impedance path are connected in parallel between a rail voltage and the fuse supply. A switch in the low impedance path may be controlled to allow current flow in the low impedance path to the fuse supply for reading or blowing a fuse and to prevent current flow in the low impedance path during testing. The test circuit of the embodiment may also include a switch in the high impedance path so as to allow current to flow in the high impedance path for testing the fuse.

In order to indicate test results, the test circuit may include an output circuit connected to the fuse supply for providing an output signal. During testing with current flowing through the high impedance path, the output signal has a success value if current flows through the fuse and has a failure value if current does not flow through the fuse. More particularly, the output circuit may be an inverter. In addition, the test circuit may include a logic gate connected to the fuse supply for tying the fuse supply to ground when the switch in the high impedance path and the switch in the low impedance path are both preventing current flow.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments of the invention provide a built-in self test for one-time-programmable memory to determine if its programming circuitry, circuit element(s), (e.g., fuse(s)), or both are functioning properly. Embodiments make use of the existing internal programming machine and built-in self-test logic already present in a component that has one-time-programmable memory, such as an application specific integrated circuit (ASIC), to check the programmability of the memory and its corresponding programming circuitry. This is accomplished by using a test mode with supporting logic around the bit-cells that allows the testing of the programmability of the memory without actually programming the circuit element (e.g., blowing the fuses) and allows it to be implemented with as small a circuit as possible. The test mode includes two primary tasks (1) check that each location of the memory is blank or unprogrammed; and (2) individually check the programming circuitry for each memory bit for connectivity and function.

As known by those skilled in the art, one-time-programmable (OTP) memory typically is used to store data in a reliable manner. OTP memory usually is read a byte at a time through the logic surrounding the bit-cells. To program the OTP memory, there is usually an on-board state machine which steps through each byte to be programmed and then through each bit in the byte to program the bits. Normally, this state machine and the logic surrounding the bit-cells looks at the data-in lines to the memory to determine which bits are to be programmed. With a slight modification of the programming state machine and the logic surrounding the bit-cells, the programming state machine may be adapted to a built-in self-test machine that reads each byte and then steps through each bit in each byte to determine whether the memory and its corresponding programming circuitry is functioning correctly.

The programming circuitry function may be tested by a memory tester that limits current to the fuse within a one-time-programmable memory module to a low amplitude current signal. The amplitude of this current signal is sufficiently low not to permanently change the state of a circuit element (e.g., blow the fuse).

If the current signal successfully transmits through the fuse, then the memory tester delivers an output signal indicating that the programming circuitry and fuse are functioning properly. Conversely, if the current signal does not successfully transmit through the fuse, then the memory tester delivers an output signal indicating that the program circuitry, fuse, or both are not functioning properly. Details of illustrative embodiments are discussed below.

Figure 1:
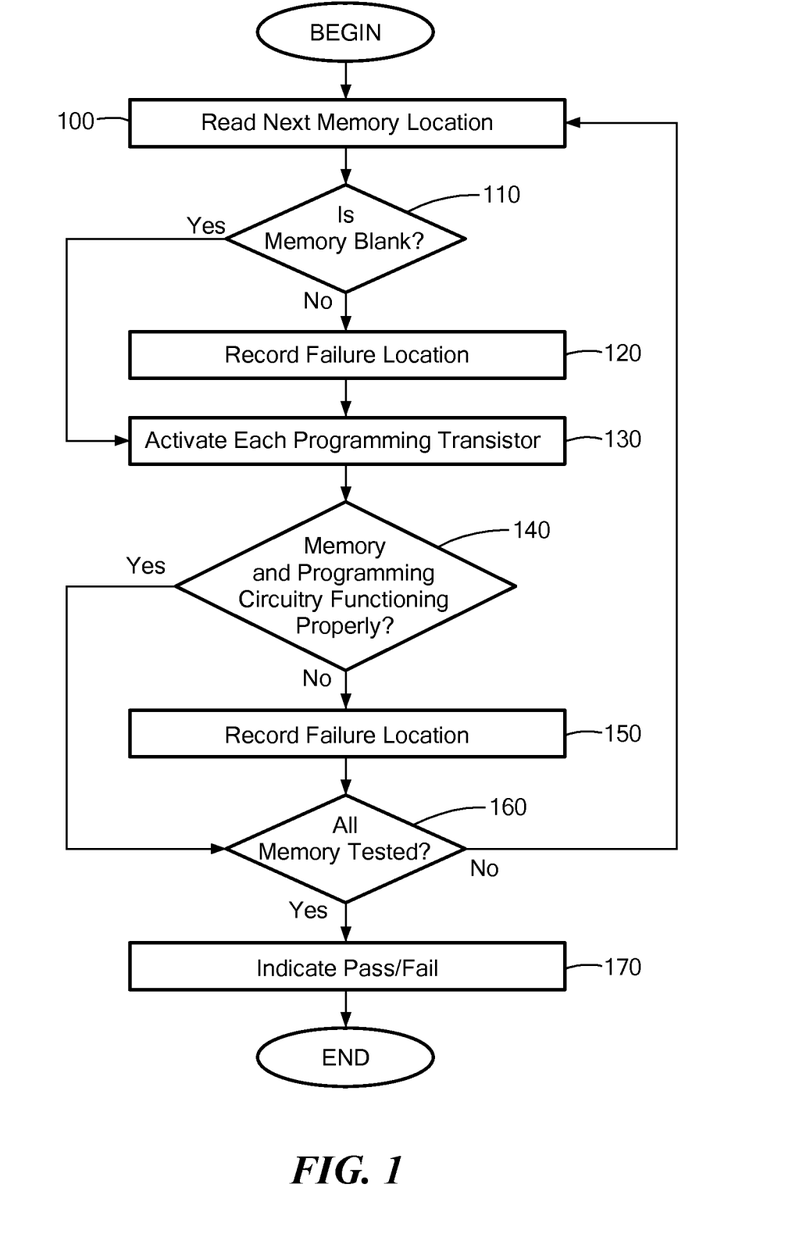
FIG. 1 schematically shows a method of testing one-time-programmable memory in accordance with illustrative embodiments of the invention.

FIG. 1 shows a method of testing one-time-programmable memory in accordance with illustrative embodiments of the invention. The process begins at step 100, which reads the first or next subsequent memory location. In step 110, the process verifies whether the memory location is blank, e.g., the byte reads zero. If the memory location is not blank, e.g., the byte reads one, the process records the failure location in step 120. If the memory location is blank, or after the failure location is recorded, the process activates each programming circuit within the memory location in step 130. For example, each bit in the byte is selected and the corresponding programming transistor is activated to see that it functions properly, e.g., the programming transistor is able to draw some of the programming current.

Figure 2:
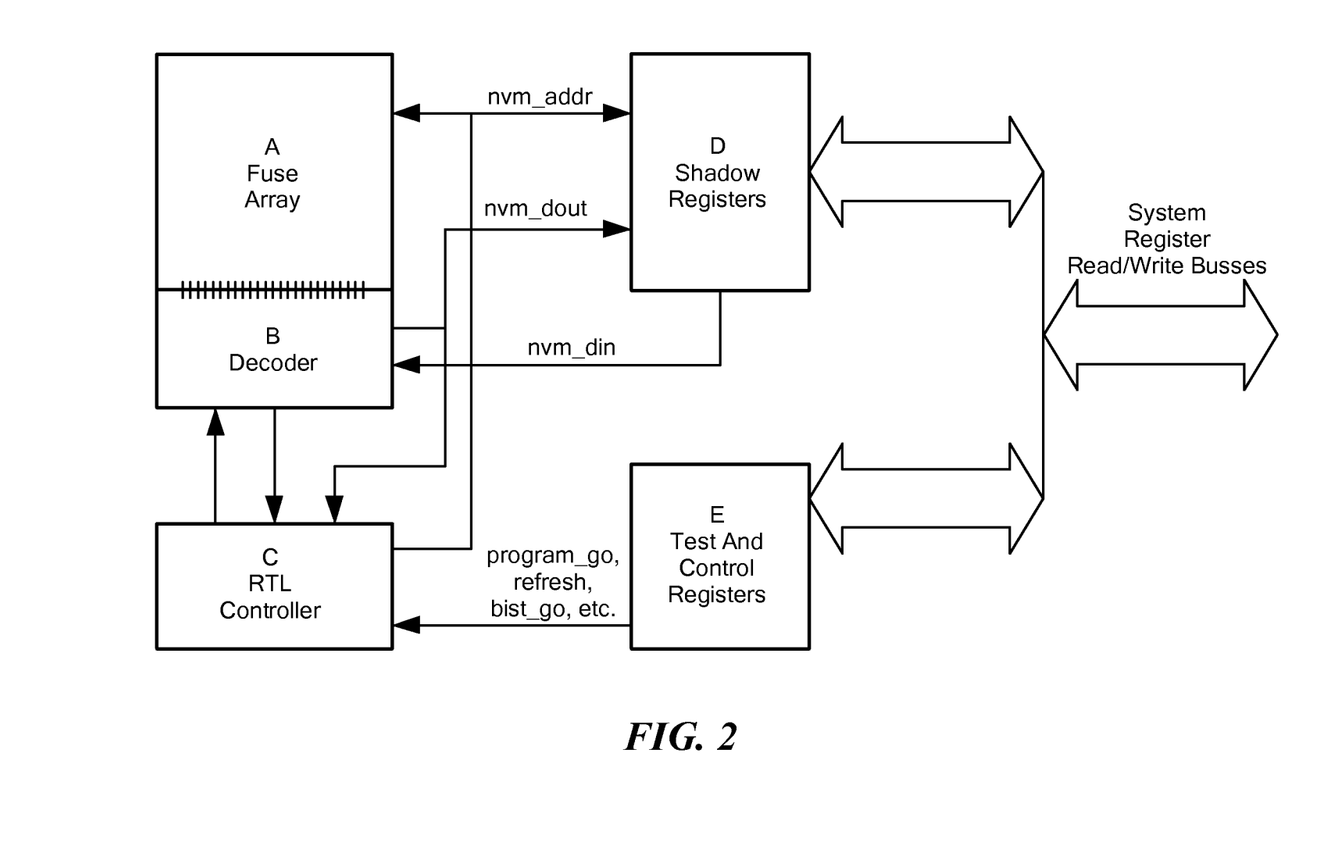
FIG. 2 schematically shows a block diagram with some elements in a one-time-programmable memory testing system in accordance with illustrative embodiments of the invention.

As discussed in more detail below, FIG. 2 shows a block diagram for a OTP memory testing system and FIGS. 3-6 describe one possible circuitry that may be employed in the bit-cell and surrounding circuitry to ensure that only a test current is applied and the contents of the bit-cell are not disturbed. While the programming transistor is activated, the output of the circuit is observed either using the normal read path or a special test signal that indicates successful activation of the programming transistor. Accordingly, the process verifies whether the memory and programming circuitry is functioning properly in step 140. If the memory or programming circuitry, or both are not functioning properly, then the process records the failure location in step 150. If the memory and programming circuitry are functioning properly, or after the failure location is recorded, the process verifies whether all of the memory has been tested in step 160. If all of the memory has not been tested, then the process returns to step 100, and reads the next memory location. If all of the memory has been tested, then the process indicates whether the OTP memory and its corresponding programming circuitry is function properly in step 170. For example, the process may indicate that the OTP memory has passed or failed the self test. The process may optionally provide a status report indicating which memory locations or corresponding programming circuitry is defective.

One embodiment of a OTP memory testing system is shown in FIG. 2. Block A includes a one-time-programmable memory circuit that may be used with illustrative embodiments of the invention, as discussed in more detail below with regard to FIGS. 3-5. Block C includes a testing mode and programming mode with supporting logic for implementing illustrative embodiments of the invention. Block E includes test and control registers where the testing or programming commands and pass/fail status results are passed to and from Block C. It should be noted that FIG. 2 shows additional components and/or blocks that are not necessary for implementation of various embodiments.

Figure 3:
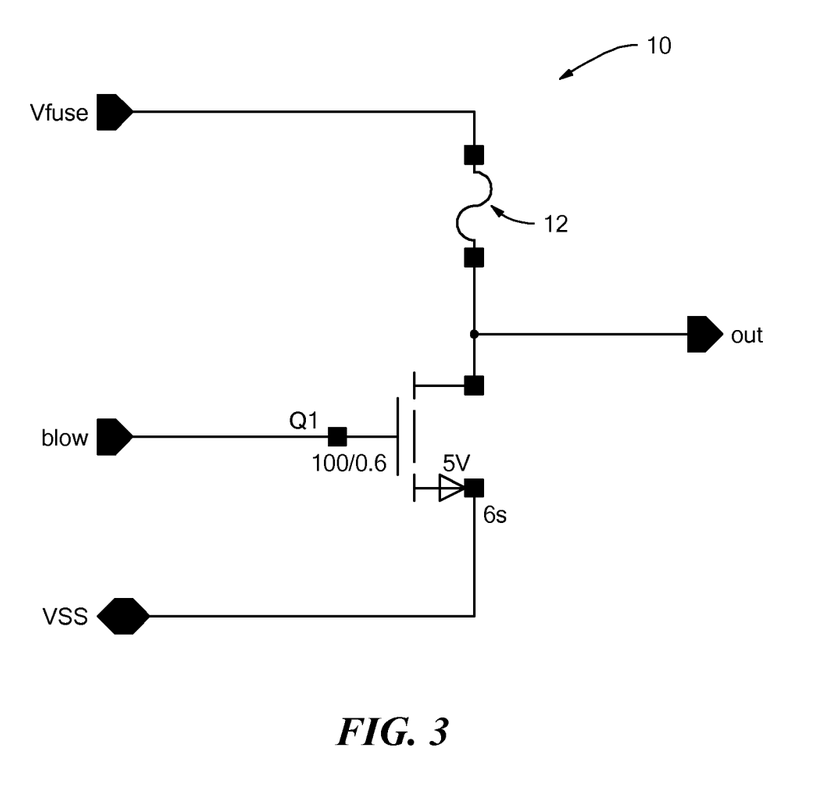
FIG. 3 schematically shows a one-time-programmable memory circuit that may be used with illustrative embodiments of the invention.

The circuit of FIG. 3 thus has a fuse 12 with one side coupled to a fuse supply port for receiving a fuse voltage (identified in the figures as "Vfuse"), and another side coupled to a blow transistor Q1 and low side power source Vss. To blow the fuse 12, a blow signal is applied to the gate of blow transistor Q1, causing Q1 to close the circuit between the fuse 12 and the low side power supply. In closing the circuit, transistor Q1 substitutes a low impedance for a high impedance between the fuse 12 and ground, i.e., the low side power source Vss. Accordingly, when the circuit is closed, a sufficiently high current applied to the Vfuse port passes through the fuse 12 and to Vss through the blow transistor Q1, blowing the fuse 12.

To determine if the fuse 12 has blown, downstream circuitry (shown in subsequent figures as a "read amplifier") draws a small current from an output port between the blow transistor and the fuse 12. Using this current, the read amplifier compares the voltage across the fuse 12 to a reference resistor. The value of the reference resistor is larger than that of the fuse 12 if the fuse 12 is not blown. Conversely, the value of the reference resistor is smaller than that of the fuse 12 if the fuse 12 is blown. This comparison thus explicitly indicates whether or not the fuse 12 is blown.

Various embodiments can use a number of different types of fuses. For example, some embodiments use a polysilicon thermal rupture fuse. Specifically, as known in the art, such a fuse typically is formed from polysilicon doped to lower its sheet resistance. This fuse operates much in the way a conventional electrical fuse does. Specifically, when a large amount of current passes through it, the fuse blows (i.e., it ruptures).

As a second example, the fuse may use electromigration as its programming method. More particularly, typically another material at a lower sheet resistance, such as cobalt silicide, is deposited on top of undoped polysilicon. A moderate, controlled amount of current is applied to the fuse, most of which flows through this cobalt silicide. Momentum of the electrons in the current flow is transferred to the cobalt silicide molecules, eventually causing molecules to migrate toward one end of the fuse. When enough molecules have moved, the resistance of the fuse increases substantially. This process is known as electromigration. Undoped polysilicon commonly is used as the base layer since its sheet resistance is higher than doped polysilicon. This results in a larger difference in resistance between a fuse that has been programmed, and another that has not been programmed.

Figure 4:
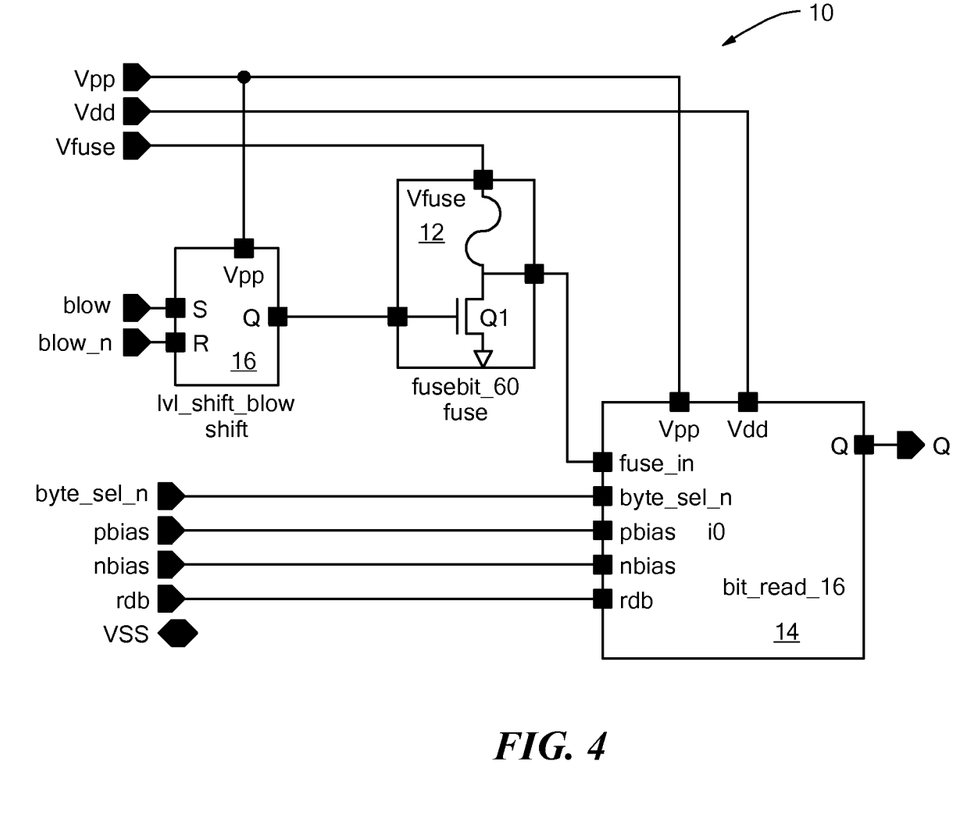
FIG. 4 schematically shows additional details of the circuit of FIG. 3.

FIG. 4 schematically shows more details of the circuit of FIG. 3. Specifically, in addition to showing the fuse 12, FIG. 4 also shows blow circuitry 16 that receives a precursor to the blow signal from upstream (related) circuitry, and generates an appropriate input to the gate of the blow transistor Q1. Among other things, blow signal assertion circuitry can include the blow circuitry 16, level shifting functionality and the blow transistor Q1. If the blow signal assertion circuitry is not defective, when it tries to assert a blow signal to the fuse, the blow signal is applied to the gate of blow transistor Q1, causing Q1 to substitute a low impedance for the high impedance between the fuse 12 and the low side power supply. FIG. 4 also shows a read amplifier 14, noted above, which determines if the fuse 12 has been blown. As shown, the read amplifier 14 is connected to the output port of the fuse 12.

Figure 5:
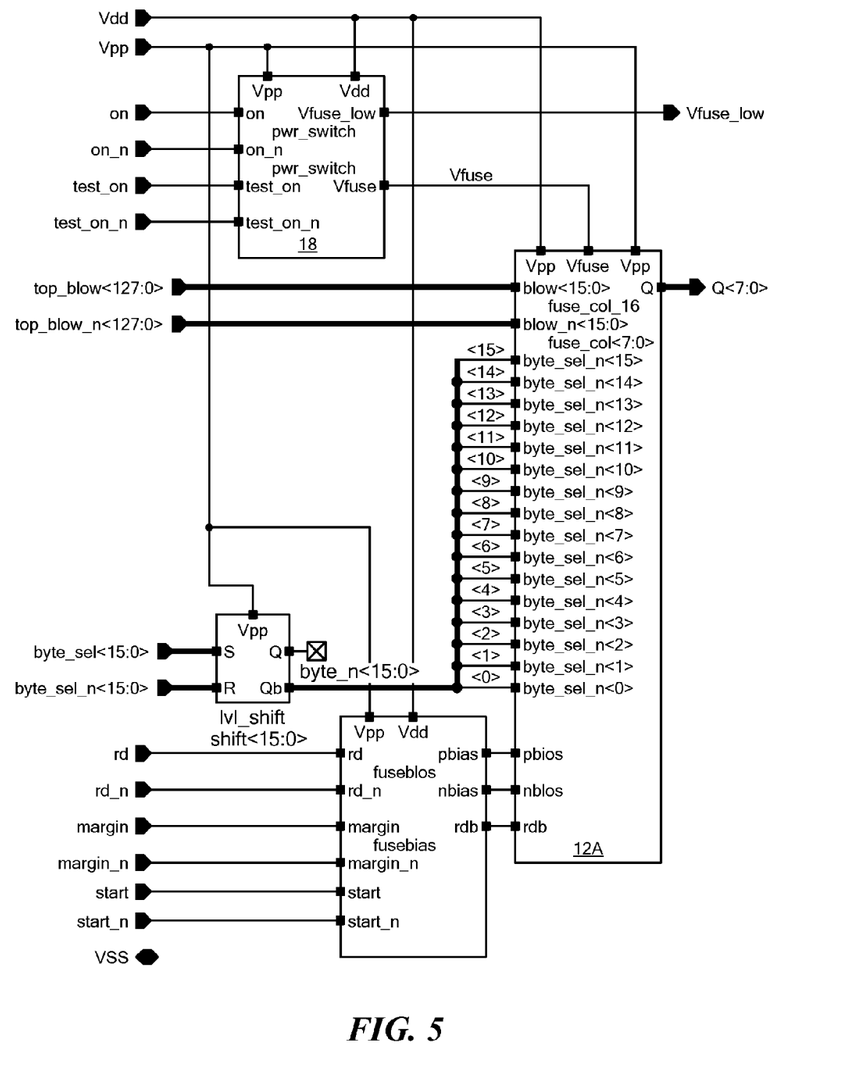
FIG. 5 schematically shows one-time-programmable memory integrated into a system implementing illustrative embodiments of the invention.

FIG. 5 schematically shows illustrative embodiments of the invention implemented within a system shown in FIGS. 3 and 4. In particular, FIG. 5 shows a fuse array 12A (also referred to as a "one-time-programmable memory module") which contains the circuit elements of FIG. 4 for acting upon each of the fuses 12 in the array. Thus, blow circuitry 16 and read amplifier 14 are integrated with the fuse array 12A. The read amplifier 14 detects which fuses 12, if any, have been programmed/blown. Thus, although discussed generally as used with a single fuse 12, various embodiments apply to arrays of fuses.

In accordance with illustrative embodiments of the invention, the circuit of FIG. 5 also has a fuse tester 18 coupled with the fuse array 12A. As shown in FIG. 5, the fuse tester 18 has input ports for implementing testing of fuses in the fuse array 12A, and a fuse supply (identified as "Vfuse," shown in FIGS. 3 and 4) for connecting the fuse array 12A with a high voltage rail Vpp. The fuse tester 18 also has a test output (identified as "Vfuse_low") for delivering a signal indicating the status of the blow signal assertion circuitry and fuses 12 during a test. When not conducting a test (e.g., when programming the fuse array 12A), the fuse tester 18 electrically connects the high voltage rail Vpp via a low impedance path through its fuse supply Vfuse and to the fuse array 12A. During a test, on the other hand, a high impedance path is substituted for the low impedance path. This substitutes a current limited to less than the threshold current for the low impedance connection to the high voltage rail.

Figure 6:
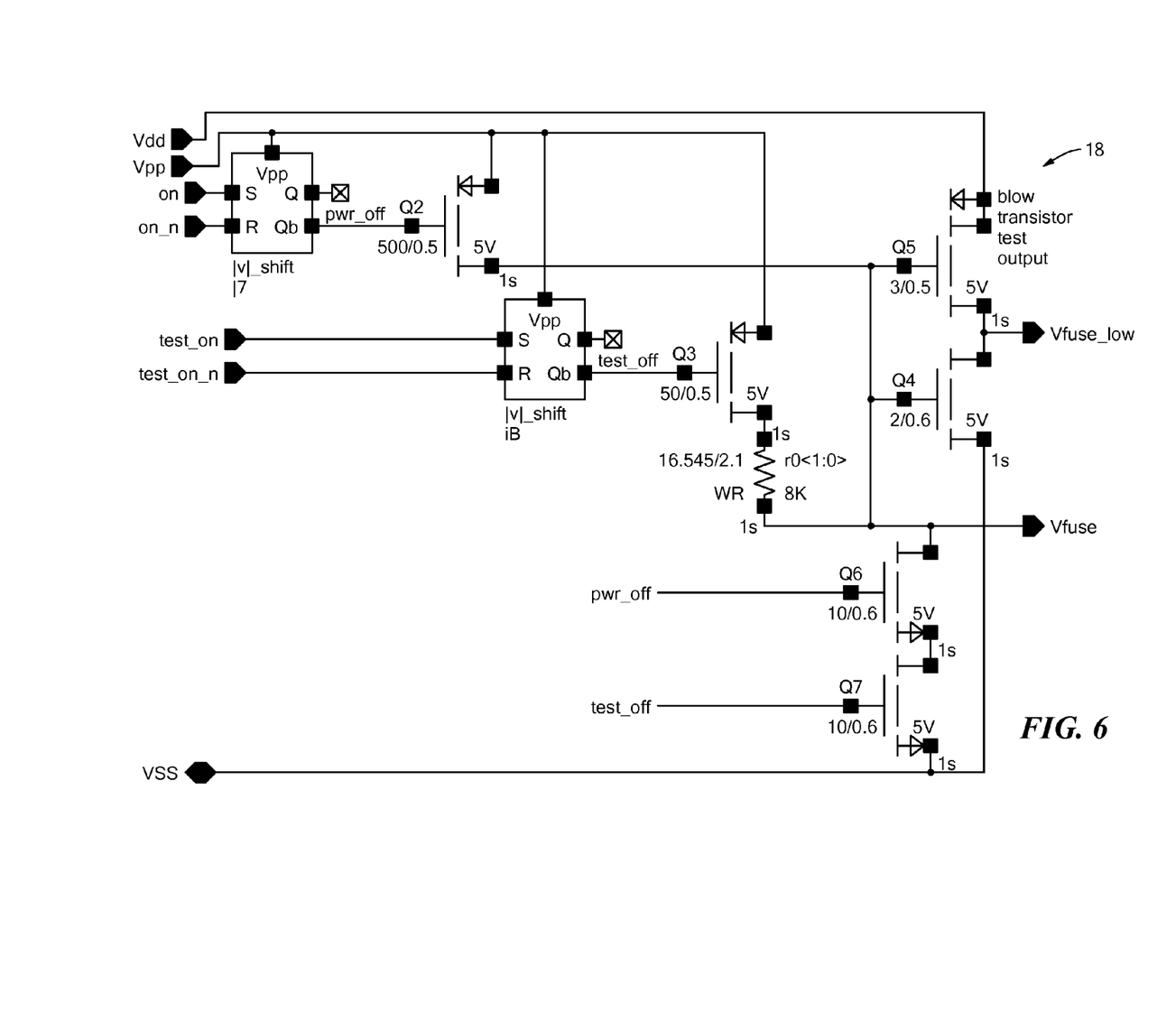
FIG. 6 schematically shows additional details of the memory tester shown in FIG. 5.

The fuse tester 18 is shown in greater detail in FIG. 6. In general, the fuse tester 18 can be programmed to either 1) connect the voltage rail Vpp to the fuse supply Vfuse via a low impedance circuit path, or 2) impose a high impedance, such as resistor R0, between the voltage rail Vpp and the fuse supply Vfuse. In other words, to accomplish the second option, the high impedance path is substituted for the low impedance path. R0 has a high enough resistance to limit the current to the fuse supply Vfuse to less than a threshold current, where the threshold current is that amplitude of current which would cause the fuse to blow. The threshold current may be more commonly known as the fuse blow/program threshold current.

As noted above, the fuse tester 18 limits current in the high impedance path to the fuse supply Vfuse when in a testing mode, and applies the high-voltage of the voltage rail Vpp through the low impedance path to the fuse supply Vfuse when programming the fuse(s). To those ends, the fuse tester 18 may be considered to have two modes:

a test mode for testing the programming circuitry and fuses 12, and a programming mode for programming the fuses 12.

Illustrative embodiments execute these two modes at separate times. For example, a semiconductor manufacturer may run the test mode before shipping the product having the fuse(s) 12 and circuitry shown in the figures. An end-user or a downstream supplier, however, also may run the programming mode to program the fuses 12. Of course, the two modes can be run at any time in the supply chain, such as by a semiconductor manufacturer, a downstream supplier or system user.

When in the programming mode, a programming signal is applied to programming port (identified as "on"), which turns on a programming transistor Q2. The switch Q2 is in the low impedance path. Turning on Q2 enables the voltage rail Vpp to apply a high-voltage to the fuse supply Vfuse, which, as shown in FIG. 3, enables a user to selectively program the fuses 12 in the fuse array 12A. For any fuse at which a blow signal is asserted, the low impedance path will provide sufficient current from the voltage rail Vpp to blow the fuse.

Conversely, when in the test mode, a test signal applied to the test port (identified as "test_on_n") actuates a test transistor Q3. The switch Q3 is in the high impedance path. As noted above, illustrative embodiments do not apply the programming signal to the programming port at this time. Thus, for testing typically switch Q2 prevents current flow and Q3 allows current flow. With the low impedance path blocked and the high impedance path allowing current flow, a limited current will be allowed to flow through any fuse for which a blow signal is asserted. Actuating transistor Q3 connects rail voltage Vpp to the fuse supply Vfuse through a relatively high resistance resistor R0, as noted above. For example, the resistor R0 may have a resistance of approximately 4 kiloohms. The rail voltage Vpp and resistor R0 are configured to limit current in the high impedance path to a very low amplitude test current signal that flows through the fuse supply Vfuse (assuming the blow signal assertion circuitry operates properly and the fuse 12 is not blown).

As FIG. 3 most simply shows, this small current will not flow through the fuse 12 unless the blow transistor Q1 completes its circuit. The blow transistor Q1 must be activated by a blow signal to substitute a low impedance for the high impedance it presents to the circuit when it is not activated. Accordingly, during the test mode, a blow signal also is applied to permit this test current to pass through the fuse 12. As noted above, this current has a sufficiently low amplitude that does not blow/rupture the fuse 12.

Returning to FIG. 6, this low current should cause a large voltage across resistor R0, and a smaller voltage across the fuse 12. This low resistance presented to the supply Vfuse from the blow transistor Q1 and unblown fuse 12 (to ground) pulls the supply Vfuse to ground. Accordingly, when this happens, the fuse supply Vfuse is considered to have a logical low output signal, indicating that the fuse 12 is not blown and the blow signal assertion circuitry is operating properly. To detect this signal, the fuse tester 18 has an output circuit connected to the fuse supply Vfuse. In the embodiment of FIG. 6, the output circuit is an inverter circuit, shown schematically as having transistors Q4 and Q5. The inverter circuit has a test output, identified as "Vfuse_low," which has a logical level that is opposite to that of the fuse supply Vfuse. In this example, the test output Vfuse_low delivers a logical high signal, indicating that the blow signal assertion circuitry is functioning properly and the fuse 12 is not blown. Accordingly, in this embodiment, downstream circuitry can read the test output Vfuse_low to determine if the fuse 12 is blown, or the blow signal assertion circuitry is operating properly.

The above discussion assumes that the fuse 12 is not blown and the blow circuitry 16 is operating properly. If the fuse 12 has been blown, then minimal current flows through it and resistor R0, causing fuse supply Vfuse to be read as a logical high. In a similar manner, if the blow transistor Q1 or the circuitry leading up to it is defective and the blow signal thus fails to substitute a low impedance for the high impedance in series with the fuse, then minimal current flows through resistor R0, also causing Vfuse to be read as a logical high. The fuse supply Vfuse thus has a high-voltage controlled by rail voltage Vpp and, accordingly, delivers a logical high signal. Consequently, the test output Vfuse_low delivers a logical low signal, indicating that the fuse 12 is blown and/or the blow signal assertion circuitry is not functioning properly. If the blow transistor Q1 is defective in such a manner that it constantly shorts the fuse to ground, then the fuse will be blown whenever it is connected to the rail voltage Vpp through the low impedance path and thus the defect will be detected by detecting the blown fuse.

It should be noted that the figures show additional components not necessary for implementation of various embodiments. For example, if neither the "on" nor "test_on" signals are asserted, then rail voltage Vpp is disconnected. If "pwr_off" and "test_off" are then asserted, additional transistors Q6 and Q7 would pull the fuse supply Vfuse to voltage Vss in that case. Q6 and Q7 thus act as a logic gate tying the fuse supply voltage Vfuse to ground (the low voltage Vss) when neither "pwr_off" and "test_off" are asserted. In other words, when the switch Q2 in the low impedance path and switch Q3 in the high impedance path are both preventing current flow, the logic gate formed by Q6 and Q7 can be made to pull Vfuse down to Vss.

The high impedance path through the switch Q3 and resistor R0 and the low impedance path through switch Q2 are connected in parallel between the rail voltage Vpp and the fuse supply Vfuse. During testing the high impedance path will be substituted for the low impedance path, thus restricting testing to conditions in which the current through the fuse is limited to an amount below the threshold current. Illustrative embodiments therefore favorably permit testing of the fuse 12 and its corresponding circuitry without blowing/rupturing/setting the fuse 12.

As one skilled in the art will recognize, embodiments of the test discussed above cannot detect a short circuit in certain circumstances. For example, as discussed above, if the blow transistor Q1 constantly shorts the fuse to ground then the test could indicate that the transistor passed, but the fuse would blow as soon as it is connected to the voltage rail Vpp. Therefore, it is beneficial to read (which applies the voltage rail Vpp to the fuses) the memory cells first before testing the memory array. Reading all of the memory cells first will cause any fuse connected to a shorted blow transistor Q1 to blow. The blown fuse would then be detected in the subsequent memory testing process.

Embodiments may be implemented using the existing internal programming machine and built-in self-test logic already present in the component. For example, a user may test the programmability of the OTP memory by entering a test mode. The test mode then asserts a test control signal to the logic around the bit cells. This test control signal activates the programming circuitry as described above in FIGS. 3-6 and sets a decode logic to ignore the state of the data-in lines since every bit must be tested in the memory. The test mode may start the programming machine, which first selects a bit and checks it for blank. The programming machine may select each bit in the byte for programming and may check the function of the programming transistor by observing the data or status signal. This process is then repeated for each bit in the byte and for each byte in the memory. When the test mode completes, a report may issue that indicates the pass or fail status of the programmability of the OTP memory.

Although the above discussion discloses various exemplary embodiments of the invention, it should be apparent that those skilled in the art can make various modifications that will achieve some of the advantages of the invention without departing from the true scope of the invention.

What is claimed is:

1. A method of testing one-time-programmable memory, the method comprising:
   providing one-time-programmable memory having one or more memory locations for storing data and corresponding programming circuitry for each memory location, each programming circuitry having a circuit element configured to permanently change state to store the data in the memory;
   reading each memory location to verify that the memory location is unprogrammed;
   activating the programming circuitry for each memory location, wherein activating includes applying a test signal to the programming circuitry, the test signal amplitude less than a threshold signal amplitude needed to permanently change the state of the circuit element; and
   determining whether the programming circuitry is functioning properly.

2. The method as defined by claim 1 wherein activating the programming circuitry comprises:
   limiting the test signal through the one-time-programmable memory to a low amplitude signal, the one-time-programmable memory having the circuit element configured to permanently change state upon receipt of a signal having a threshold amplitude, the low amplitude signal being less than the threshold amplitude;
   using programming signal assertion circuitry to attempt to assert the test signal to the circuit element, the circuit element not permanently changing state in response to flow of the low amplitude test signal through the circuit element; and producing an output signal having a success value if the programming circuitry is functioning properly and a failure value if the programming circuitry is not functioning properly.

3. The method as defined by claim 2 wherein the low amplitude signal comprises a current signal.

4. The method as defined by claim 2 wherein the output signal has the failure value if the programming circuitry cannot assert the test signal to the circuit element.

5. The method as defined by claim 2 wherein the output signal has the failure value if the circuit element has permanently changed state.

6. The method as defined by claim 2 wherein a voltage source is in series with the one-time-programmable memory and wherein the circuit element is configured to permanently change state if the test signal through the one-time-programmable memory is not being subjected to said limiting and the programming circuitry attempts to assert the programming signal when the programming signal assertion circuitry is not defective.

7. The method as defined by claim 2 wherein producing an output signal comprises detecting a voltage at a supply to the circuit element.

* * * * *